(12) United States Patent
Su et al.

(10) Patent No.: US 8,692,289 B2
(45) Date of Patent: Apr. 8, 2014

(54) FAST TURN ON SILICON CONTROLLED RECTIFIERS FOR ESD PROTECTION

(75) Inventors: Yu-Ti Su, Tainan (TW); Tzu-Heng Chang, New Taipei (TW); Jen-Chou Tseng, Jhudong Township (TW); Ming-Hsiang Song, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/558,154

(22) Filed: Jul. 25, 2012

(65) Prior Publication Data

US 2014/0027815 A1    Jan. 30, 2014

(51) Int. Cl.
| | | |
|---|---|---|
| H01L 29/74 | (2006.01) | |
| H01L 31/111 | (2006.01) | |
| H02H 3/00 | (2006.01) | |
| H02H 7/00 | (2006.01) | |
| H02H 9/02 | (2006.01) | |

(52) U.S. Cl.
USPC .............. 257/146; 257/183; 257/E21.409; 257/E29.002; 257/E29.256; 361/100; 361/205

(58) Field of Classification Search
USPC ............ 257/146, 183, E21.409, E29.002, 257/E29.256; 438/133; 361/100, 205
See application file for complete search history.

(56) References Cited

U.S. PATENT DOCUMENTS

| | | | |
|---|---|---|---|
| 4,896,243 A | 1/1990 | Chatterjee et al. | |
| 4,939,616 A | 7/1990 | Rountree | |
| 5,465,189 A | 11/1995 | Polgreen et al. | |
| 5,473,169 A * | 12/1995 | Ker et al. | 257/173 |
| 5,838,043 A * | 11/1998 | Yuan | 257/355 |
| 6,172,403 B1 * | 1/2001 | Chen | 257/355 |
| 6,229,183 B1 * | 5/2001 | Lee | 257/360 |
| 7,342,281 B2 * | 3/2008 | Kim et al. | 257/355 |
| 7,542,253 B2 | 6/2009 | Ker et al. | |
| 7,566,595 B2 * | 7/2009 | Steinhoff | 438/133 |
| 7,834,400 B2 * | 11/2010 | Huang | 257/355 |
| 7,839,612 B1 * | 11/2010 | Chan | 361/56 |
| 2002/0187601 A1 * | 12/2002 | Lee et al. | 438/200 |
| 2003/0047786 A1 * | 3/2003 | Lee et al. | 257/355 |
| 2005/0151160 A1 * | 7/2005 | Salcedo et al. | 257/173 |
| 2006/0262471 A1 * | 11/2006 | Van Camp | 361/56 |

(Continued)

OTHER PUBLICATIONS

Ker, M. et al. "Low-Capacitance SCR With Waffle Layout Structure for On-Chip ESD Protection in RF ICs," IEEE Transactions on Microwave Theory and Techniques, May 2008, vol. 56, No. 5, pp. 1286-1294.

*Primary Examiner* — David S Blum
(74) *Attorney, Agent, or Firm* — Slater & Matsil, L.L.P.

(57) ABSTRACT

Fast turn on silicon controlled rectifiers for ESD protection. A semiconductor device includes a semiconductor substrate of a first conductivity type; a first well of a second conductivity type; a second well of the second conductivity type; a first diffused region of the first conductivity type and coupled to a first terminal; a first diffused region of the second conductivity type; a second diffused region of the first conductivity type; a second diffused region of the second conductivity type in the second well; wherein the first diffused region of the first conductivity type and the first diffused region of the second conductivity type form a first diode, and the second diffused region of the first conductivity type and the second diffused region of the second conductivity type form a second diode, and the first and second diodes are series coupled between the first terminal and the second terminal.

20 Claims, 8 Drawing Sheets

(56) References Cited

U.S. PATENT DOCUMENTS

| | | | |
|---|---|---|---|
| 2007/0108527 A1* | 5/2007 | Lee et al. | 257/356 |
| 2008/0044955 A1* | 2/2008 | Salcedo et al. | 438/140 |
| 2008/0067605 A1* | 3/2008 | Tyler et al. | 257/369 |
| 2009/0230426 A1* | 9/2009 | Carpenter et al. | 257/173 |
| 2009/0283898 A1* | 11/2009 | Janzen et al. | 257/698 |
| 2010/0103570 A1* | 4/2010 | Song et al. | 361/56 |
| 2010/0208405 A1* | 8/2010 | Russ et al. | 361/101 |
| 2010/0321843 A1* | 12/2010 | Domanski et al. | 361/56 |
| 2011/0133247 A1* | 6/2011 | Sarbishaei et al. | 257/173 |
| 2011/0180845 A1* | 7/2011 | Mallikarjunaswamy | 257/173 |
| 2011/0207409 A1* | 8/2011 | Ker et al. | 455/63.1 |
| 2011/0266624 A1* | 11/2011 | Duvvury et al. | 257/360 |
| 2012/0074539 A1* | 3/2012 | Yu et al. | 257/659 |
| 2012/0119257 A1* | 5/2012 | Gauthier et al. | 257/173 |

* cited by examiner

FAST TURN ON SILICON CONTROLLED RECTIFIERS FOR ESD PROTECTION

BACKGROUND

Electrostatic discharge ("ESD") protection structures are needed for integrated circuits. In ESD protection, an ESD circuit is formed near integrated circuit terminals such as input and output pads, and also for power supply terminals. The ESD protection circuit provides a path to bypass current from the terminal to a ground or from the terminal to a power supply rail, so that the current bypasses the internal circuitry. Voltages far in excess of the operating voltages, in both positive and negative magnitudes, are observed during short duration electrostatic discharges. The ESD protection structure prevents the corresponding ESD current from destroying sensitive components in an integrated circuit.

Silicon controlled rectifiers ("SCRs"), which may be conveniently formed by forming parasitic transistors in doped well regions adjacent a terminal, are often used for ESD structures. Because an SCR can be designed to "trigger" in response to a trigger voltage over a threshold, and then safely conduct ESD stress current through an alternative path and thus protect the internal circuitry coupled to a pad terminal, the SCR provides many features that are desirable for ESD protection.

However, the existing SCR structures also have some characteristics that are undesirable. Existing SCR circuits have relatively slow turn on speed and add capacitance to the input pins, which can create noise or degrade performance for RF circuits, for example. Further, existing SCR circuits have relatively high trigger voltages. As the semiconductor devices produced become increasingly smaller, the thin gate oxides formed become even more susceptible to ESD. Improved ESD circuits are needed with fast turn on speed and low trigger voltages, and with reduced capacitance and without substantially increasing silicon area.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example embodiments and are not necessarily drawn to scale.

DETAILED DESCRIPTION

The making and using of illustrative example embodiments are discussed in detail below. It should be appreciated, however, that an illustrative embodiment provides many applicable inventive concepts that can be embodied in a wide variety of specific contexts. The embodiments herein are illustrative examples but do not limit the scope of the disclosure, and do not limit the scope of the appended claims.

In the embodiments, low capacitance SCR based ESD structures are formed using approaches that include providing N+ and P+ diffused regions in wells to form, in one example configuration, a p-n-p-n current path between a pad under protection and a voltage supply terminal, which bypasses the internal circuit coupled to the pad. Because the SCR in this configuration acts as a forward biased current path, it is said to have an anode, and a cathode. The anode of the SCR structure is coupled to the pad, while the cathode of the SCR structure is coupled to the voltage supply terminal. A series diode string structure is used to increase the turn on speed for the SCR. The diode string is formed using at least one additional well adjacent the well coupled to the pad, and serially coupling p-n junction diodes. By serially coupling the diodes, the parasitic capacitance observed at the pad terminal is reduced; the string diodes also provide additional speed in turning on the SCR after an ESD trigger event. One modeled ESD event that is of concern is the charged device model ("CDM") event. In a CDM event, the model is that the device, such as a circuit, becomes charged by electrostatic forces and then comes into contact with a grounded surface, discharging. Because a charged device model ("CDM") ESD strike is very rapid, for example, a 0.2 nanosecond rise time, and a 1 nanosecond duration for the transient pulse, a very quick turn on ESD structure is needed to adequately protect the internal circuitry, which may include very thin gate oxide MOSFET devices, for example. Current and future devices formed in advanced semiconductor processes may have gate oxides that still thinner, and which easily rupture under stress at increasingly low voltages, as low as 1 Volt or less, as the circuit operating voltages continue to fall with process scaling, to far less than 1 Volt, for example.

Figure 1A:
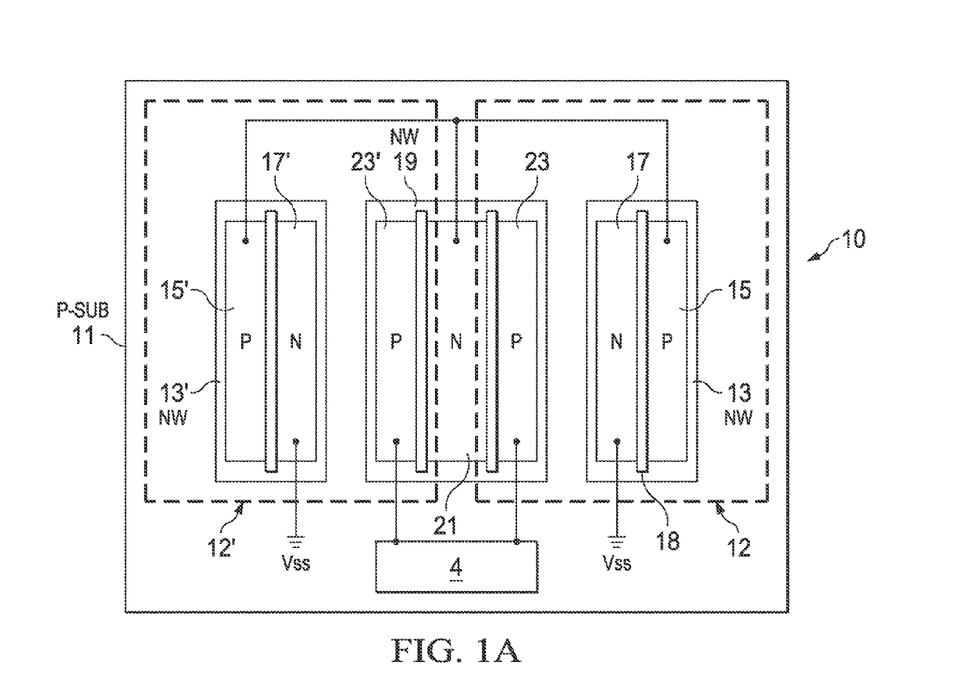
FIGS. 1A and 1B depict in a plan view, and a cross-sectional view, respectively, an illustrative embodiment.
Figure 1B:
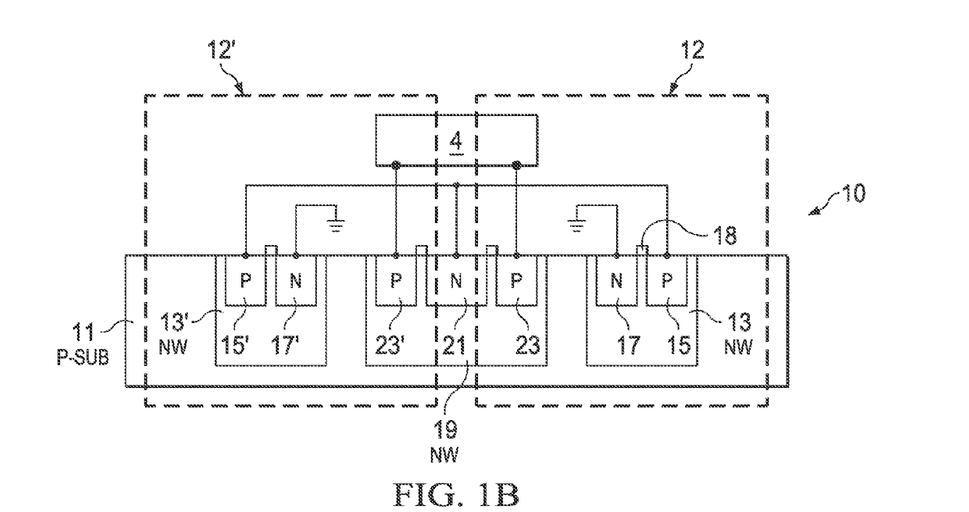

FIGS. 1A and 1B depicts in a plan view or top view, and a cross sectional view, an example embodiment of a SCR structure 10. In FIG. 1A, a portion of a semiconductor substrate 11 is depicted in a plan view. Semiconductor substrate 11 may be an N-type or P-type doped substrate, and may be formed from silicon, gallium arsenide, silicon germanium or other known semiconductor materials used in semiconductor device processing. Although in the illustrated examples presented herein for explanation a semiconductor substrate is used, in other alternative embodiments epitaxially grown semiconductor materials may be used, or, silicon on insulator (SOI) layer may be used, as the substrate 11. While the semiconductor substrate 11 may be doped with either N-type or P-type impurities, in the examples presented herein, the substrate 11 is a P-type substrate, labeled P-SUB in the figures.

Dopant impurities are implanted into the semiconductor material to form P+, and, P-type regions in semiconductor material, and N+ and N-type regions, as is well known. Dopant atoms for P-type regions include boron, for example. In N-type regions, dopant atoms include phosphorous, arsenic, and antimony, for example. Doping may be done by ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allow for in-situ doping during the epitaxial processes. Implantation can be done through certain materials, such as thin oxide layers, as is known. Concentrations following the doping may range from 1E16 atoms/cm$^3$ to 1E22 atoms/cm$^3$, with P+ and N+ concentrations being greater than about 1E18/cm$^3$, for example.

The well regions may be formed using two different dopants implanted into substrate 13. Alternatively a doped substrate, such as a P-type substrate, may be doped only to form an N well, with the remainder of the substrate 13 acting as the P well.

Semiconductor manufacturing processes that may be used to form the structure 10 include photolithography, wet and dry etching, plasma etching, ashing, chemical vapor deposition, plasma vapor deposition, plasma enhanced chemical vapor deposition, electroless plating and electroplating, silicidation, oxide deposition including thermal oxidation, TEOS, spun on glass and other oxide and nitride depositions, planarization processes such as CMP, forming isolation regions using trenches or local oxidation of silicon (LOCOS) and the like. SCR ESD structures that have P and N wells, and example processes for forming them, are described in patent application U.S. Ser. No. 13/176,780, entitled "Bidirectional Dual-SCR Circuit for ESD Protection", filed Jul. 6, 2011, which is hereby incorporated herein by reference in its entirety.

In FIGS. 1A and 1B, first N-type doped well region 19 is formed within the semiconductor substrate 11. A pair of symmetrical second doped N-well regions 13 and 13' are also formed in the semiconductor substrate 11, spaced from well 13 and each doped to an N-type well. The well regions 19, 13 and 13' are formed into substrate 11, which in this example is P-type; thus the common boundary of the well regions 19, 13 and 13' as seen in the cross section of FIG. 1B form P-N junctions. The doping concentration amounts for the wells regions and the N+ and P+ diffusions described below may vary with the process used and the particular design but may range from 1E16 to 1E22 atoms/cm$^3$, for example. P+ and N+ regions are usually doped to greater than 1E18 atoms/cm$^3$, for example although other impurity concentrations can be used.

The SCR structure 10 shown as an example in FIGS. 1A and 1B includes two complete SCR protection structures labeled 12 and 12'. Each SCR structure 12 and 12' are coupled to a PAD terminal that is to be protected from ESD events, and the two symmetric structures, which form identical ESD protection circuits, are coupled in parallel. In an alternative embodiment, only one of each of these structures could be formed at a circuit terminal and provide a single SCR protection structure. For efficient use of silicon area, and for added protection, the embodiments explained here will show the parallel symmetric SCR structures, such as in FIGS. 1A and 1B, but the embodiments are not so limited, and the alternative embodiments formed by using only one of the structures at a pad terminal, for example, form additional embodiments contemplated herein and within the scope of the appended claims. Note that when the two structures 12 and 12' are provided they can share the N-well 19, and the N+ diffusion 21, for example, saving substrate area.

Returning to FIGS. 1A and 1B, the PAD terminal that is to be protected is coupled to P+ diffusion regions 23 and 23'. For ease of explanation, the description that follows will focus on structure 12, while the reader easily understands that SCR structure 12' is identical to and coupled in parallel with SCR structure 12. The P+ diffusion 23, labeled 'P' in the figures for simplicity, forms a p-n junction with the N-well 19. An N+ diffusion region 21 is formed in the central portion of N-well 19 and is electrically coupled (i.e., by a conductor) to another N-well region 13. The conductor connects the N+ diffusion (labeled 'N' in the figures) to a P+ diffusion 15 in N-well 13. Polysilicon regions 18 are formed over the substrate and may be logic gate material, for example, and are electrically floating. These regions are formed in part to satisfy typical design rules that specify either a gate conductor, or an STI isolation region, be placed between P+ and N+ diffusion regions. As the STI isolation would be inappropriate for the ESD structures, the gate polysilicon material 18 is formed instead, but in this example is not electrically connected.

Another N+ diffusion 17 is then electrically coupled to ground, or Vss. Starting at the PAD terminal, the current path to ground has traversed P+ region 23, N+ region 21, P+ region 15, and N+ region 17, or a p-n to p-n path, of two serially connected diodes; that is, a diode string.

In addition, there is an SCR path to ground from the PAD terminal in structures 12 and 12'. Returning again to FIGS. 1A and 1B, stating at the PAD terminal, P+ region 23 receives the voltage at the PAD terminal. A P-N junction is formed with the P+ diffusion 23 and N-well 19. A path into the P-SUB 11 then forms an N-P junction. The current then can flow into N-well 13 from the P-SUB 11, a P-N junction, and into the N+ diffusion 17, which is coupled to ground, or Vss.

Thus the path from the PAD terminal is: a P+ to N-well to P-Sub to N-well path, or a p-n-p-n path, which is an SCR current path using parasitic transistors, as is known. The two bypass current paths then provide ESD current paths to gate current from a transient ESD strike at the PAD terminal to Vss, away from an internal circuit coupled to the PAD terminal.

Figure 2:
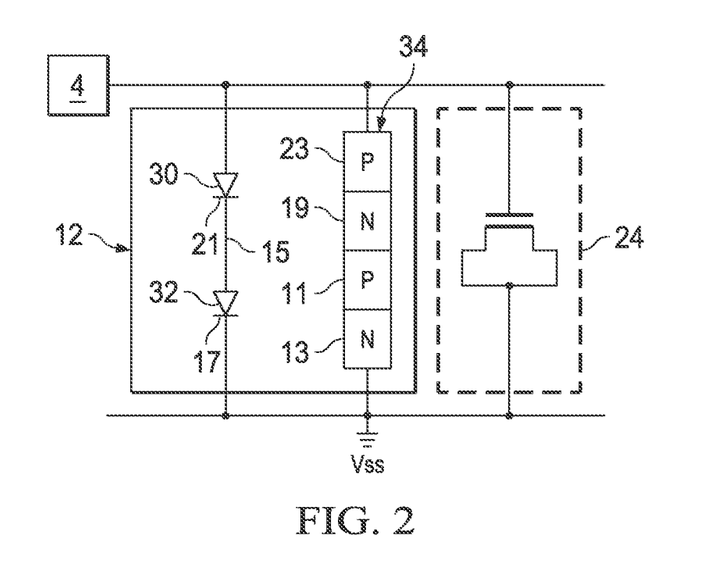
FIG. 2 depicts in a simple block diagram an application of the embodiment of FIG. 1.

FIG. 2 illustrates the SCR structure 12 in a simple block diagram showing how SCR structure 12 can protect an internal circuit, 24, in an integrated circuit. Structure 12 is coupled adjacent or very near the PAD terminal, which may be an input, output or input/output pin for an RF or other integrated circuit. Diodes 30 and 32 form the serial diode string as explained above, while the reference numerals 23, 21, 15 and 17 indicate the P+ diffusion 23, N+ diffusion 21, P+ diffusion 15, and N+ diffusion 17 of FIGS. 1A and 1B in SCR structure 12. The p-n-p-n SCR path is shown by block diagram 34, and the reference numerals corresponding to the structures are shown, with P+ diffusion 23 forming the first P portion, N-well 19 forming the first N portion, P-SUB 11 forming the next P portion, and N-well 13 forming the last N portion coupled to ground. So the SCR structure 12 includes the two diode string of diodes 30, 32 and the SCR 34.

Figure 3:
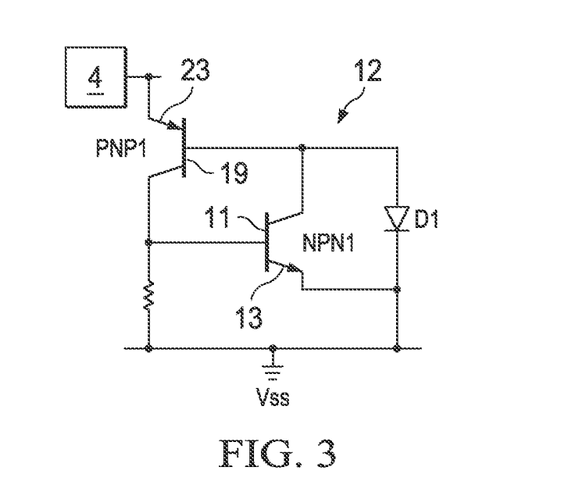
FIG. 3 depicts in a simple circuit diagram an embodiment.

FIG. 3 is a typical circuit schematic for an SCR circuit hooked up to provide protection between a PAD terminal and VSS under a positive stress mode from the pad to Vss, a so called "PS" mode ESD protection. Again the reference numerals for the particular structures are shown from FIGS. 1A and 1B above, with P+ region 23 forming an emitter for the parasitic transistor PNP1, N-well 19 forming the base of the PNP1 and the collector for the parasitic transistor NPN1, P-SUB 11 forming the base for the NPN1 and the collector for the PNP1, and N-well 13 forming the emitter for NPN1. Diode D1 represents the diode string.

In operation, when the voltage at the PAD terminal receives an ESD voltage that exceeds a trigger voltage Vt, the SCR 12 will turn on and conduct current through the p-n-p-n path to ground. After the initial turn on, the circuit will pull down the voltage at the PAD terminal and stay active so long as a voltage exceeding a hold voltage Vh is at the PAD terminal. In some existing circuits the holding voltage can be too low and lead to a "latch up" problem. An advantage of the use of the various embodiments of this disclosure is that easy adjustments can be made to the holding voltage Vh and the trigger voltage Vt to optimize the ESD protection. The diode string can be extended easily, as explained below, changing the turn on speed and the trigger and holding voltages.

Because once the device 12 is triggered "on" and active, the SCR structure 20 acts as a low resistance current path, the emitter of PNP1 is the anode terminal of the SCR. The emitter of the NPN1 coupled to ground or Vss is the cathode terminal of the SCR. In the embodiment of FIGS. 1A and 1B these terminals correspond to the P+ diffusion, 23, coupled to the PAD terminal, and the N+ diffusion, 17, coupled to Vss.

Figure 4A:
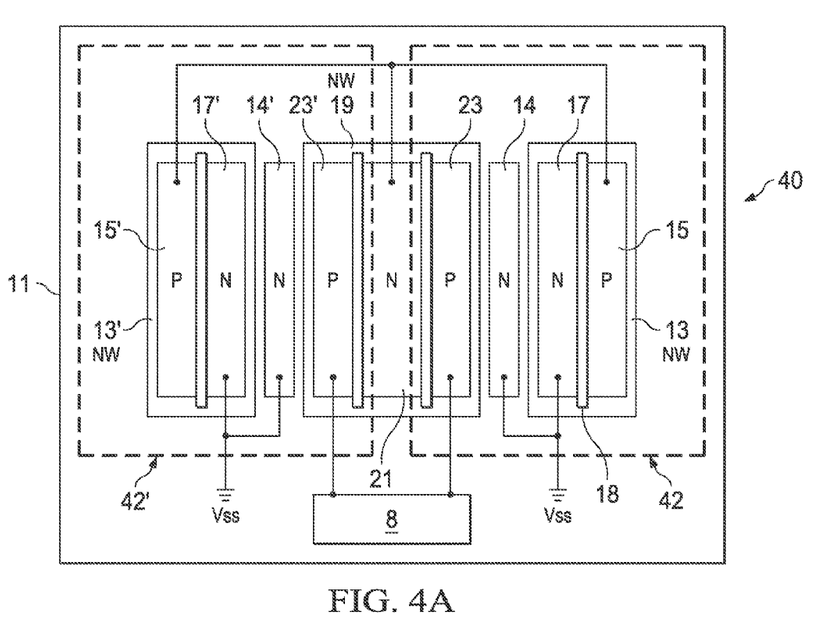
FIGS. 4A and 4B depict in a plan view, and a cross-sectional view, respectively, another illustrative embodiment.
Figure 4B:
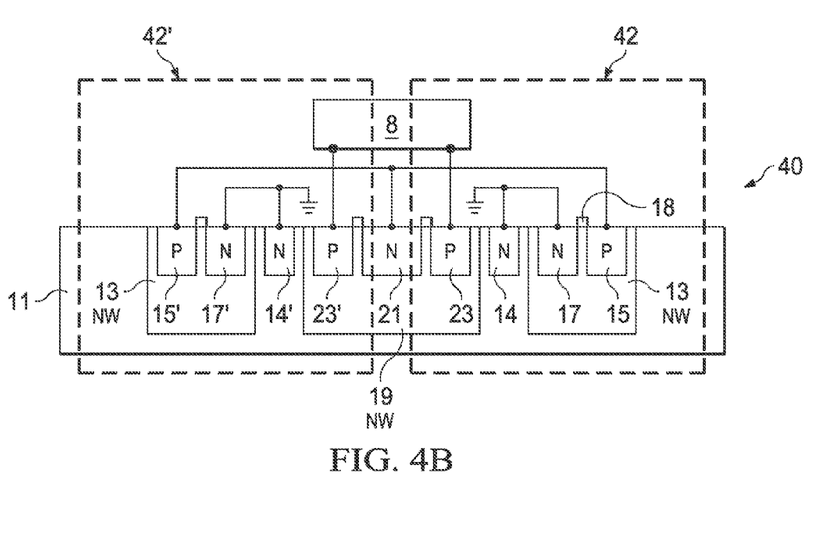

FIGS. 4A and 4B illustrate in a plan view and a cross section, respectively, another embodiment SCR structure 40, having additional features. However, many of the elements of SCR 40 in FIGS. 4A and 4B are common to the embodiment ESD structure 10 depicted above in FIGS. 1A and 1B, and like numerals are used for like elements, where the structures and operations are the same, no further description is provided.

In FIGS. 4A and 4B, the N-well regions are again formed as doped diffusions in a semiconductor substrate doped to a P-type, that is P-SUB 11. However, in addition, the spaces between the N-well regions now receive additional N+ diffusions 14 and 14'. These added N+ diffusions improve the device performance without any area penalty, because the design rules for semiconductor processes have a minimum well to well spacing requirement, an N-well to N-well space. The added N+ diffusions are then placed in these spaces, and the N+ diffusions are coupled to ground terminal or Vss.

As shown in FIGS. 4A and 4B, in a plan view and a cross sectional view, respectively, an ESD protection structure 40 can be formed at a PAD terminal. Each ESD structure 40 is illustrated with two, identical, SCR structures 42 and 42', coupled in parallel. Each SCR structure 42 and 42' are similar to the SCR structures 12 and 12' described above, except that in addition to the N-wells 13 and 19, the SCR structures 42 and 42' include an additional N+ diffusion 14 and 14' disposed between the N-well regions in the substrate P-SUB 11. These additional N+ diffusions provide added performance by reducing the spacing distance between the cathode terminals such as N+ diffusion 17 in N-well 13, and the anode terminals such as P+ diffusions 23 in N-well region 19, by adding an additional path to ground as another cathode terminal, N+ diffusions 14 or 14'. Thus the anode to cathode spacing is reduced and that improves the SCR performance. As before, although the structure 40 depicted in FIGS. 4A and 4B in plan and cross sectional views includes two SCR structures 42 and 42'; in an alternative embodiment, the PAD terminal could be coupled to only a single SCR structure 42, however, additional protection is provided by coupling two SCR structures 42 and 42' in parallel.

Figure 5A:
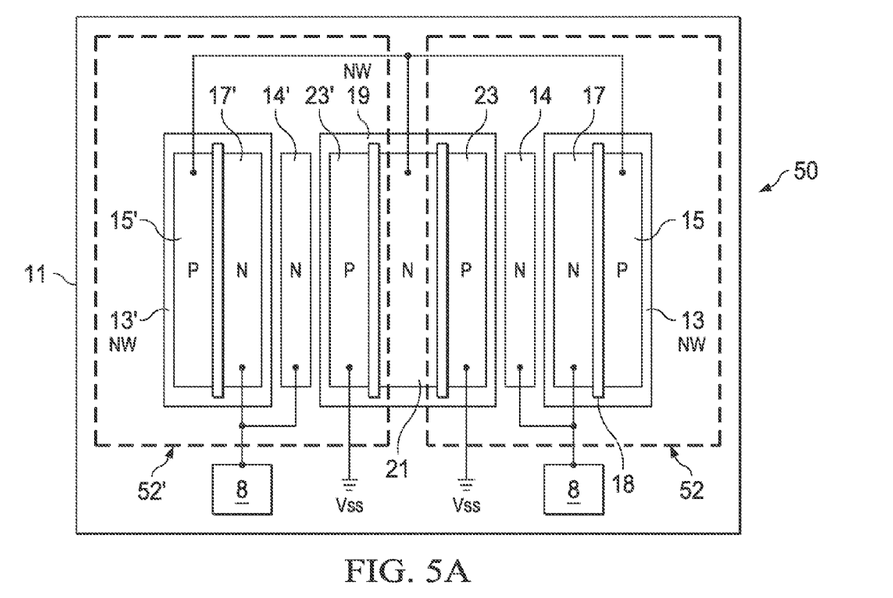
FIGS. 5A and 5B depict in a plan view, and a cross-sectional view, respectively, still another illustrative embodiment.
Figure 5B:
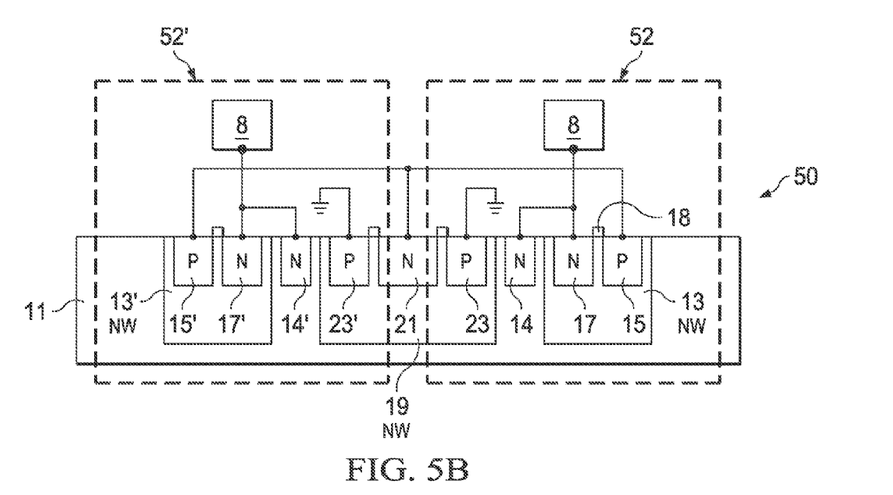

FIG. 5 depicts another alternative embodiment that incorporates the features of FIG. 4 in a negative strike mode ESD protection structure 50. As is known to those skilled in the art, the same SCR structures shown above coupled in a positive PAD to VSS protection circuit (PS mode) can be used to provide protection for a strike that is negative from the PAD to Vss, that is a negative ESD voltage event at the PAD. This stress mode is referred to as "NS" mode.

FIGS. 5A and 5B depict an alternative embodiment 50. In FIGS. 5A and 5B, a plan view and a cross section, respectively, are shown. The SCR structures 52 and 52' are physically identical to that of FIGS. 4A and 4B, however, by coupling the N-wells 19, 13' and 13 between Vss and the PAD terminal (instead of between the PAD terminal and Vss) a negative strike mode ESD protection structure 50 is formed. The SCR structures 52 and 52' are identical in form to the SCR structures 42 and 42' described above, except for the electrical connections.

In FIGS. 5A, the plan view, and 5B, the cross sectional view, the structure features are identical to the features of FIGS. 4 and 4B above, except that the anode terminals (P+ diffusions 23, 23') are coupled to the ground terminal or Vss, and the cathode terminals (N+ diffusions 17, 14, 17', 14') for the parallel SCR structures 42, 42' are coupled to the PAD terminal.

As before, the example illustrated in FIGS. 5A and 5B depicts two parallel SCR structures 52 and 52' each coupled to the VSS terminal and to the PAD terminal, to form two parallel ESD SCR protection devices. However, in an alternative embodiment, only one of the structures 52 and 52' could be coupled to a VSS terminal and ESD protection would be provided in the same manner. These modifications form alternative embodiments contemplated herein and within the scope of the appended claims. By forming parallel SCRs 52 and 52' as shown, additional protection is provided for an NS mode ESD event.

The embodiment of FIGS. 5A and 5B may also include the additional N+ diffusions 14 and 14' disposed between the well regions 19 and 1e. In the ESD structure 50 these diffusions are coupled to the PAD terminals (cathode connections) and reduce the spacing between the anode and the cathodes for the SCR devices 52 and 52', increasing performance.

Note that FIGS. 5A and 5B depict two PAD terminals as drawn, however, this is done only for clear illustration, and there is only one PAD terminal, the drawings show two portions of the same terminal for convenience.

Figure 6:
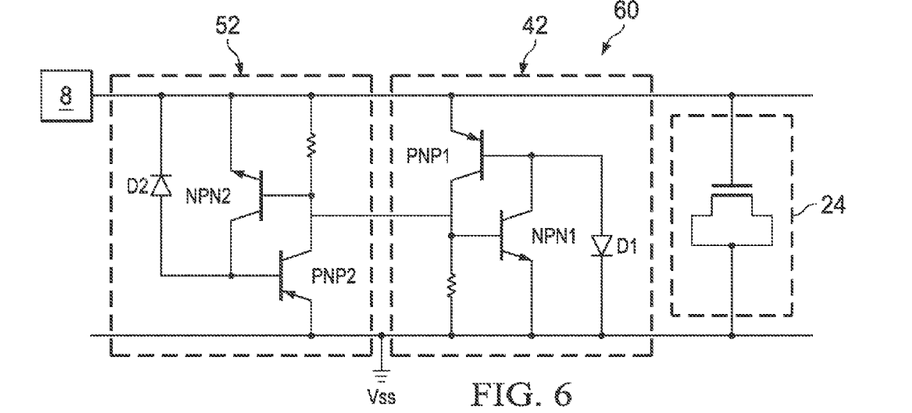
FIG. 6 depicts in a circuit schematic an application using the embodiments.

FIG. 6 illustrates in a simplified circuit schematic view of an ESD protection circuit 60 for a PAD terminal with bi-directional SCRs providing ESD strike protection. The PAD is protected from both PS mode events (positive ESD voltage at the PAD with respect to Vss or ground) and NS mode events (negative ESD voltage at the PAD with respect to Vss or ground). Using both embodiments of FIGS. 4A and 4B, above, and the embodiments of FIGS. 5A and 5B, above, a bi-directional ESD protection structure can be formed in this example application.

In FIG. 6, the PAD terminal is shown coupled to an internal circuit 24 that is to be protected by the ESD structures. SCR structure 42, the embodiment from FIGS. 4A and 4B is shown coupled to protect from a positive stress with respect to Vss at the PAD terminal. (PS mode). SCR structure 52, for example, the embodiment of FIGS. 5A and 5B, is shown coupled to protect the PAD terminal from negative ESD stress events. Note that the embodiments of FIGS. 4A and 4B may also be replaced with the embodiments of FIGS. 1A and 1B, that is, SCR structure 12 which does not include the extra N+ diffusions (14 in FIGS. 4A and 4B) that are formed between the N-wells. The ESD protection circuit 60 of FIG. 6 is not limited to a particular embodiment of the SCR structures disclosed herein, the various ESD SCR embodiments may be used in a variety of ESD protection applications.

Figure 7A:
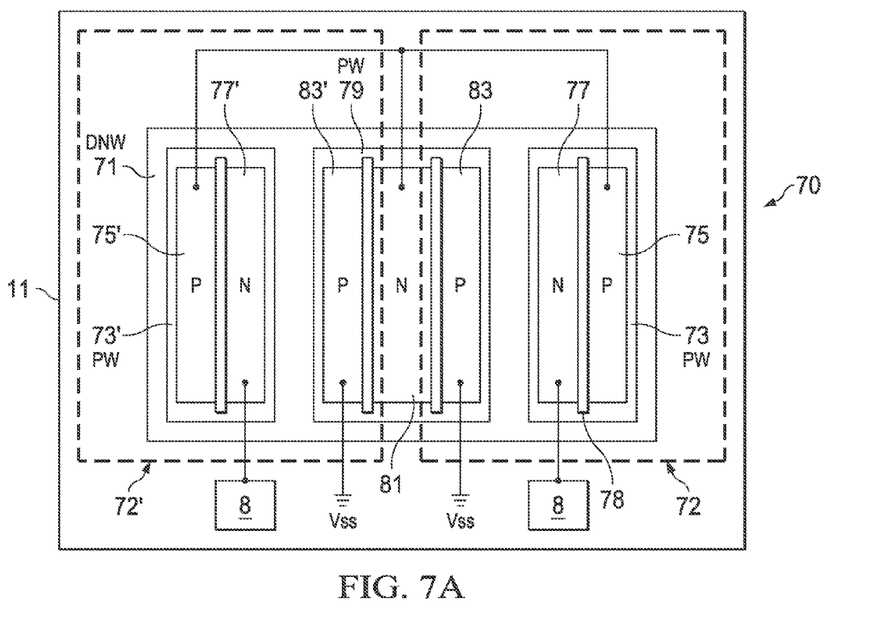
FIGS. 7A and 7B depict in a plan view, and a cross-sectional view, respectively, yet another illustrative embodiment.
Figure 7B:
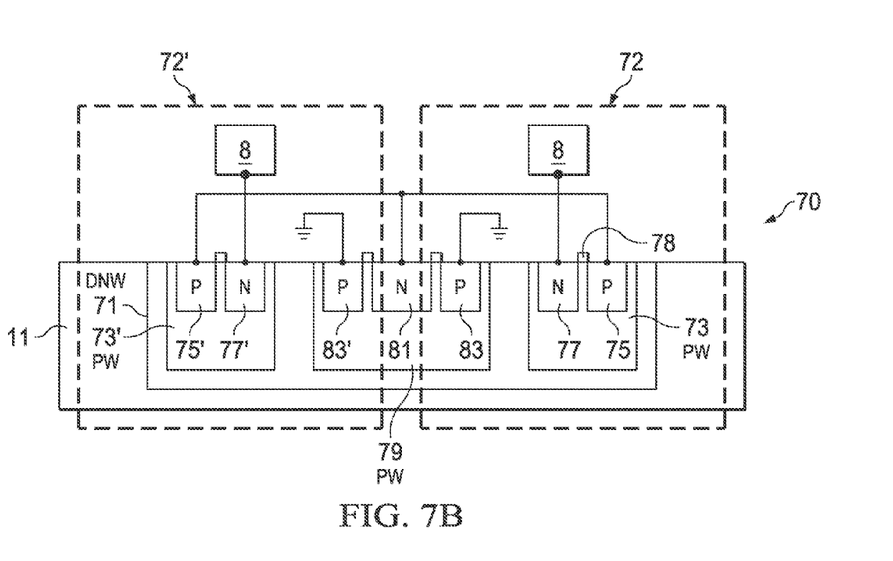

FIGS. 7A and 7B present yet another alternative embodiment of an ESD structure 70 in a plan view, and a cross sectional view. As in the above described embodiments, the ESD structure 70 as illustrated includes two complete SCR structures 72 and 72'.

The embodiments of FIGS. 7A and 7B are formed in a similar manner to the above illustrated embodiments, except that instead of N-well regions in a P-type substrate, these structures are formed in P-well regions in a deep N-well, which is formed within the P-SUB 11. By using the deep N-well, the ESD structure 70 may be formed in a reversed conductivity fashion with respect to the embodiment 12 SCR shown in FIGS. 1A and 1B above. That is, the well conductivity is reversed (to P-well conductivity) and the diffusion regions are reversed (the anode is now an P+ diffusion in a P-well, instead of a P+ diffusion in an N well, for example).

In FIGS. 7A and 7B the SCR structures 72 and 72' are formed in deep N-well 71, which extend beneath and surrounds the entire structure so that it functions similarly to the semiconductor substrate in the above embodiments. A first P-well region 79 is provided with two additional P-well regions 73 and 73' formed proximate to and spaced from the first region. A Vss terminal that is to be protected from an ESD strike, such as an NS mode event, is coupled to P+ diffusion 83 which forms an anode of the SCR 72.

An N+ diffusion 81 is formed in the P-well 79 so that the P+ diffusion 83 and the N+ diffusion 81 form a diode with a p-n junction. The N+ diffusion 81 is electrically coupled to a P+ diffusion 75 in P-well 73, and P+ diffusion 75' in P-well 73'. N+ diffusions 77 in P-well 73 and 77' in P-well 73' form a cathode terminal for the SCR structures 72, 72', and couple to the PAD terminal. An SCR path from the Vss terminal to the PAD terminal thus traverses the P+ region 83, to the P-well 79, to the DNW 71, to the P-well 73, and to the N-diffusion 77 coupled to the PAD terminal. Thus the path is P+ to deep N-well to p-well to N+, or p-n-p-n as expected for an SCR. The ESD structure 70 is also arranged to protect from an NS strike between a Vss terminal and a PAD terminal, but the use of the deep N-well and the change in conductivity types make the structures 72 low or zero leakage current devices, and thus somewhat higher performance than the NS mode embodiments described above. The processing requirements to build this embodiment are slightly more complex than the prior embodiments, processing is needed to form the deep N well and the P-wells. However, in an advanced semiconductor process for an integrated circuit these structures are often used and are highly reliable, so that no additional cost is required to implement these features.

Figure 8:
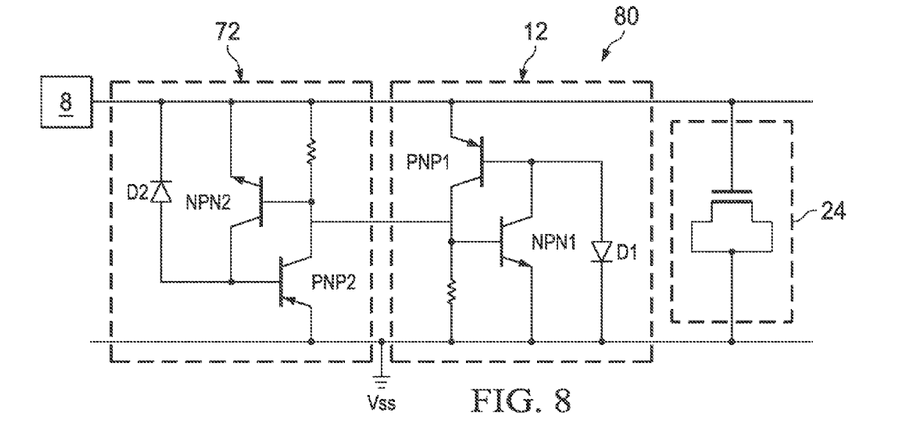
FIG. 8 depicts in a circuit diagram an application utilizing selected embodiments.

FIG. 8 depicts in a simple circuit diagram an application 80 of the SCR structure 72, as shown above in FIGS. 7A and 7B, with another embodiment, for example, SCR structure 12 from FIGS. 1A and 1B, to form a bidirectional ESD protection structure for the PAD terminal. In this circuit, if an NS ESD event occurs (negative ESD voltage at PAD with respect to Vss) then the SCR 72 will trigger and provide a bypass path for the corresponding current to the PAD terminal from Vss. If instead a PS mode ESD event occurs, then the SCR structure 12 will trigger when the voltage at the PAD exceeds the trigger voltage and the current will flow from the PAD terminal into the Vss. The internal circuit 24 which may include susceptible gate oxide devices will therefore be protected from both types of ESD event.

Figure 9A:
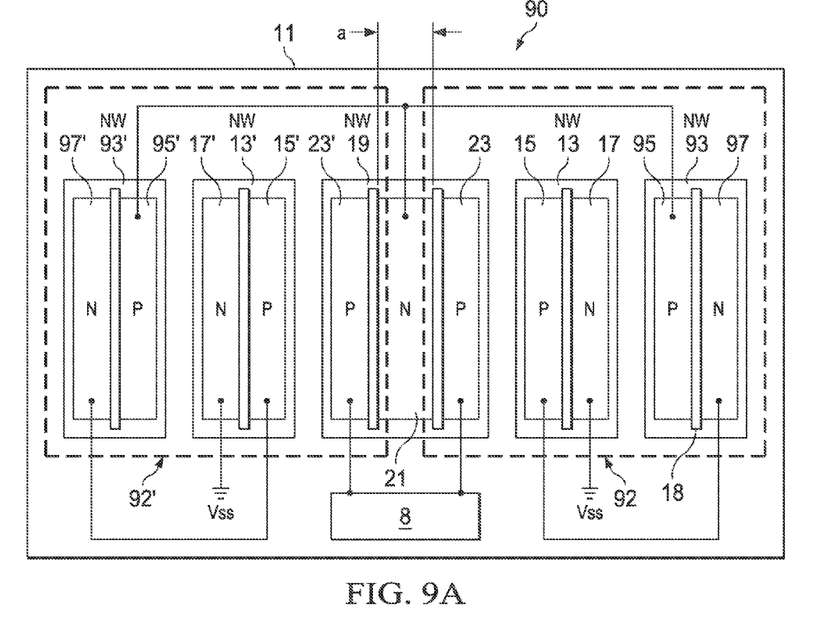
FIGS. 9A and 9B depict in a plan view, and a cross-sectional view, respectively, yet another illustrative embodiment.
Figure 9B:
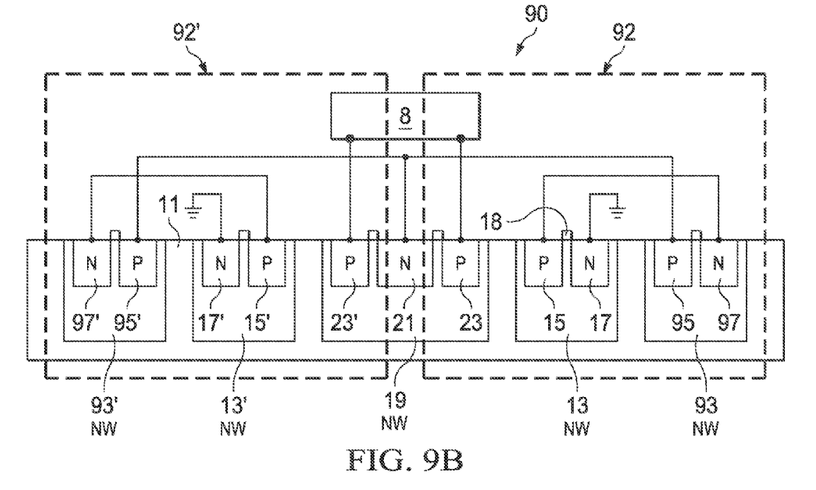

FIGS. 9A and 9B illustrate in a plan view, and a cross section, another ESD protection structure 90. In this example embodiment, the embodiment of FIGS. 1A and 1B is used and is now further extended by adding additional series diodes to the diode stack, and, forming adding additional SCR structures to further enhance the protection provided.

In FIGS. 9A and 9B, semiconductor substrate 11 is again provided as a P-type substrate. A pair of SCR structure 92 and 92' is formed. Each of these SCR structures is identical and they are coupled in parallel. A PAD terminal to be protected from a PS mode ESD event is coupled to P+ diffusion 23 in a first N-well region 19, as before. Additional N-well regions 13 and 93 are formed proximate to and spaced from N-well region 19 and from one another by at least a minimum well to well spacing as provided by a semiconductor design rule.

A current path through the parasitic SCR devices is as follows. PAD is coupled to P+ diffusion 23, and then the path continues into the N-well 19. The parasitic SCR current path continues through the substrate 11 into the N-well 13, and then the N+ diffusion 17 couples the N-well 13 to Vss or ground. So an SCR current path of P+ to N-well to P-sub to N-well is formed, that is a p-n-p-n path just as in FIGS. 1A and 1B, above.

In addition, a second SCR path is formed in this embodiment. N-well 93 is added and as explained below is used to add an additional diode to the series diode string. However, the added N-well also forms another SCR device.

Starting again at the PAD terminal, the path begins at P+ diffusion 23, into N-well 19. Now the N+ diffusion 21 is electrically coupled to the P+ diffusion 95, in N-well 93, which is added to the embodiments described above. A path from N-well 93 into the P-type substrate 11 then continues into the N-well 13, and into the Vss or ground terminal. Thus, the path from the P+ diffusion region 95, into the N-well 93, into the p-type substrate 11, and into the N-well 13, and coupled to Vss or ground, forms another p-n-p-n path-a second SCR.

The diode string is also extended in this embodiment. In FIGS. 9A and 9B, the PAD terminal is coupled to a P+ diffusion 23, then a diode is formed with N+ diffusion 21. N+ diffusion 21 is coupled to P+ diffusion 95 by electrical connection. This forms a second diode in N-well 93 with the N+ diffusion 97. N+ diffusion 97 is then coupled to the P+ diffusion 15, which forms a third diode with N+ diffusion 17, which is coupled to the ground or Vss terminal. As can be seen from FIGS. 9A and 9B, additional embodiments may be formed by adding still more N-well regions, and more diodes, to the diode string.

The diode string in the embodiment SCR structure 92 shown in FIGS. 9A and 9B is then a three diode string, one P-N diode in N-well 19, series coupled to a second P-N diode in N-well 93, which is series coupled to a third diode P-N diode in N-well 13. By using the series coupled diodes, the parasitic capacitance at the PAD terminal is reduced to ⅓ over an existing single diode approach, greatly reducing the parasitic capacitance from the ESD protection devices, and the turn on speed can be increased further for the SCR device 92.

Note that the above description also applies exactly to the identical SCR structure 92', and so that portion of the ESD protection structure 90 is not described in detail, but it is a symmetric structure and also has a three diode string and two SCR devices, and is coupled in parallel to the SCR structure 92 between the PAD terminal and the Vss terminals as shown in FIGS. 9A and 9B.

Figure 10:
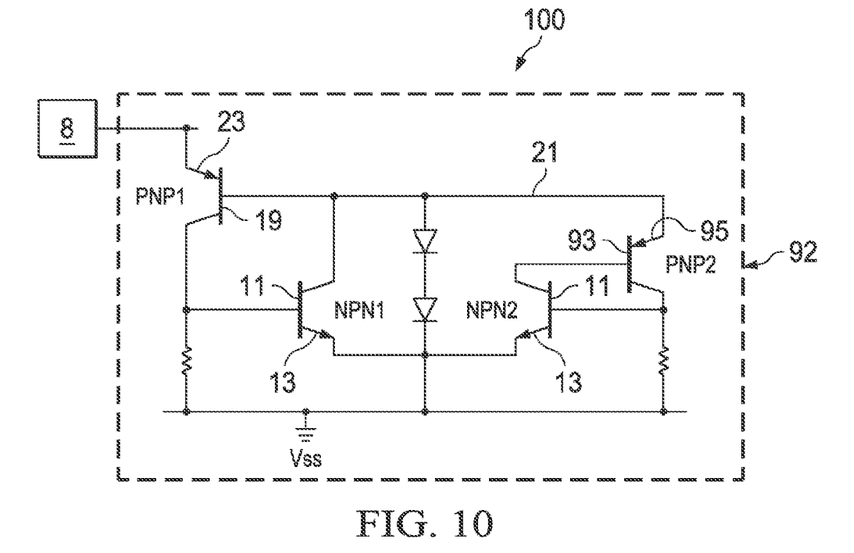
FIG. 10 depicts, in a simplified circuit schematic, an embodiment.

FIG. 10 illustrates the SCR structure 92 of FIGS. 9A and 9B in a simplified circuit schematic. Reference numerals from FIGS. 9A and 9B are used to identify the SCR paths.

The element numerals in FIG. 10 identify the portions of the SCR 92 that form the two SCR circuits. P+ diffusion 23 is coupled to the PAD terminal and forms the emitter of PNP1. The N-well 19 then forms the base for PNP1 and the collector for NPN1. P-type substrate 11 forms the base terminal for NPN1. N-well 13 forms the emitter for the NPN1 transistor, which is then coupled to Vss or ground through the N+ diffusion 17.

N+ diffusion 21 couples the N-well 19 to a P+ diffusion 95, which forms an emitter of PNP2. N-well 93 then forms the base of PNP2 and the collector of NPN2. The P-type substrate 11 then forms the base of NPN2, and the N-well 13 forms the emitter of NPN2. The emitter is then coupled to Vss or ground by the N+ diffusion 17. Thus two SCR paths of p-n-p-n are formed between the PAD terminal and Vss, increasing the current path and increasing the turn on speed, without increasing parasitic capacitance seen at the PAD terminal. Further, the additional SCR devices in this embodiment increase the holding voltage Vh, which can reduce latch up problems.

The protection circuit 100 of FIG. 10 is shown using only one of the two SCR structures 92 and 92'; in a practical application both structures are coupled in parallel and add additional protection, as described above.

The embodiments shown in FIGS. 9A and 9B also include spacing between the N-wells 19, 13, and 93, and as shown in FIGS. 5A and 5b, additional N+ diffusions may be used and placed between the N-wells in FIGS. 9A and 9B to form yet another embodiment of the SCR structures.

Figure 11:
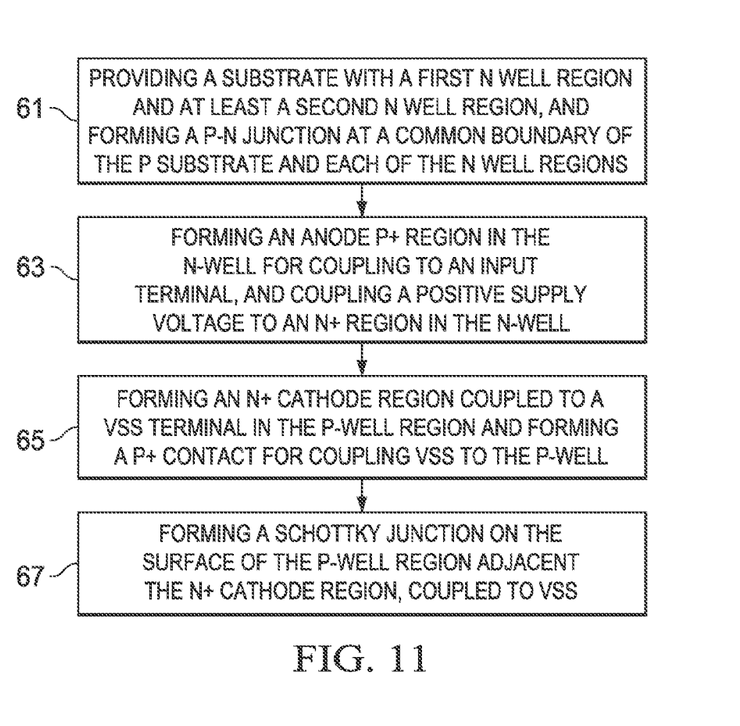
FIG. 11 depicts, in a flow chart, a method embodiment.

FIG. 11 depicts in a simplified flow diagram a method embodiment for forming the SCR structures with the series diode strings. In stage 61, a substrate is provided and first and second N well regions are formed, the well regions and the substrate boundary forming p-n junctions.

In stage 63, a PAD terminal is coupled to a P+ diffusion in the first N-well region. An N+ diffusion is formed adjacent the P+ diffusion to form a P-N diode.

In stage 65, the N+ diffusion is coupled to a P+ diffusion formed in the second N-well region. An N+ diffusion in the second N-well region is coupled to a ground terminal and forms a second P-N diode in series with the first diode.

In stage 67, an additional N well is optionally provided adjacent the second N-well and having a P+ diffusion and an N+ diffusion forming a P-N diode, this third diode is coupled in series between the first and second diodes.

The first and second N-wells and the P-type substrate also form at least one parasitic SCR structure between the PAD terminal and the Vss terminal, as described above.

Use of the embodiments has been shown to provide ESD protection structures with improved results. In silicon wafers formed implementing the embodiments, a charged device model (CDM) test using a transmission line pulse (TLP) as the ESD strike was performed. In one example, the TLP was 100 nanoseconds in duration. A test victim circuit was coupled in parallel with the ESD structure using the embodiments, as shown in FIG. 2, above, for example. The results for one example wafer were that the It2 current was 1.93 Amperes and the Vf-TLP (1 nanosecond) result was 4.9 Amperes.

The embodiments may be used together or separately as described above. Various embodiments may be combined, with various features, to form additional alternative embodiments. Robust bidirectional ESD protection structures are easily provided by coupling the embodiments with the PAD terminal to Vss path for one structure, a PS mode protection, and a Vss to PAD path in another structure, that is, a NS mode protection. Other variations and arrangements are possible. The use of the series diode string with the SCR structures provide faster turn on speed, with low parasitic capacitance, higher holding voltages, and lower on resistance, than existing ESD structures using SCR protective devices.

A variety of modifications apparent to one skilled in the art can be made to the example embodiments described above and these apparent modifications create additional alternative embodiments which are also contemplated herein and which fall within the scope of the appended claims. For example, an N-type substrate may be used with a plurality of P-wells and the conductivity types of the N+ and P+ diffusions may be reversed to form additional structures, as is known in the art. Electrical connections may be modified as described above to form additional embodiments, and the embodiments may be combined with deep N or P wells to form still more embodiments within the scope of this disclosure.

In an embodiment, a semiconductor device is provided having a semiconductor substrate of a first conductivity type; a first well of a second conductivity type formed into the semiconductor substrate; a second well of the second conductivity type formed into the semiconductor substrate spaced from the first well; a first diffused region of the first conductivity type formed at an upper surface of the first well and coupled to a first terminal; a first diffused region of the second conductivity type formed at the upper surface of the first well; a second diffused region of the first conductivity type formed at the upper surface of the second well and coupled to the first diffused region of the second conductivity type; a second diffused region of the second conductivity type formed at the upper surface of the second well and coupled to a second terminal; wherein the first diffused region of the first conductivity type and the first diffused region of the second conductivity type form a first diode, and the second diffused region of the first conductivity type and the second diffused region of the second conductivity type form a second p-n diode, and the first and second diodes are series coupled between the first terminal and the second terminal.

In an alternative embodiment, in the semiconductor device the first terminal is a pad terminal for receiving an input signal, and the second terminal is a ground terminal. In yet another alternative embodiment, in the semiconductor device the first terminal is a ground terminal, and the second terminal is a pad terminal. In still another alternative, in the semiconductor device, the first conductivity type is a P conductivity type. In yet another alternative, in the semiconductor device above, the second conductivity type is an N conductivity type. In a further alternative embodiment of the semiconductor device the first diffused region of the first conductivity type and the first well form a P-N junction, the first well and the substrate form an N-P junction, the substrate and the second well form a P-N junction, and a current path from the first terminal to the second terminal traverses a P-N-P-N current path. In a further alternative, in the semiconductor device above, the P-N-P-N current path is the current path for a silicon controlled rectifier (SCR) device coupled between the first terminal and the second terminal. In a further alternative embodiment, in the semiconductor device the first well of a first conductivity type and a second well of the first conductivity type are formed in parallel in the semiconductor substrate and spaced apart by a spacing distance, and a diffusion region of the second conductivity type is disposed between the first well region and the second well region. In a further alternative, the above described semiconductor device includes further: a deep well region of the second conductivity type disposed in the semiconductor substrate; a third well region of the first conductivity type formed within the deep well region; a fourth well region of the first conductivity type formed within the deep well region; a third diffused region of the first conductivity type formed in the third well region and coupled to a third terminal; a third diffused region of the second conductivity type formed in the third well region; a fourth diffused region of the first conductivity type formed in the fourth well region and coupled to the third diffused region; a fourth diffused region of the second conductivity type formed in the fourth well region and coupled to a fourth terminal; wherein the third diffused region of the first conductivity type and the third diffused region of the second conductivity type form a third diode, and the fourth diffused region of the first conductivity type and the fourth diffused region of the second conductivity type form a fourth diode, and the third and fourth diodes are series connected between the third terminal and the fourth terminal.

In yet another alternative, in the above described device, a current path from the third terminal through the third diffused region of the first conductivity type into the third well region, through the third well region into the deep well region, through the deep well region into the fourth well region, and through the fourth diffused region into the fourth terminal, traverses the current path for a silicon controlled rectifier formed between the third terminal and the fourth terminal.

In a further alternative embodiment, an ESD protection structure includes a pad terminal coupled to an internal circuit formed on a P-type semiconductor substrate; a first silicon controlled rectifier structure coupled to the pad terminal, including a first N-well region formed in the semiconductor substrate; a second N-well region formed in the semiconductor substrate adjacent the first N-well region; a first P+ diffusion formed in the first N-well region, coupled to the pad terminal; a first N+ diffusion formed in the first N-well region; a second P+ diffusion formed in the second N-well region, coupled to the first N+ diffusion; and a second N+ region formed in the second N-well region, coupled to a ground terminal; wherein the first P+ region and the first N+ region form a first diode, and the second P+ region and the second N+ region form a second diode, and the first and second diodes are series coupled between the pad terminal and the ground terminal to form an ESD current path from the pad terminal to the ground terminal.

In still another alternative, the ESD protection circuit includes a second current path from the pad terminal to the ground terminal that comprises a path into the first P+ region, into the first n-well region, into the p-type substrate, into the second n-well region, and into the second N+ region, to the ground terminal. In yet another alternative, the ESD protection structure includes at least one additional N+ diffusion formed in the semiconductor substrate in a spacing between the first and second n-well regions, the at least one N+ diffusion coupled to a ground terminal. In another further alternative embodiment, the ESD structure includes a second silicon controlled rectifier structure coupled to the pad terminal, comprising: a third N-well region formed in the P-type semiconductor substrate including the internal circuit; a fourth N-well region formed in the semiconductor substrate adjacent the first N-well region and spaced from the third N-well region; a third P+ diffusion formed in the third N-well region, coupled to the ground terminal; a third N+ diffusion formed in the third N-well region; a fourth P+ diffusion formed in the fourth N-well region, coupled to the third N+ diffusion region; a fourth N+ diffusion region formed in the fourth N-well region, coupled to the pad terminal; wherein the third P+ diffusion and the third N+ diffusion form a third diode, and the fourth P+ diffusion and the fourth N+ diffusion form a fourth diode, and the third and fourth diodes are series coupled between the ground terminal and the pad terminal to form an ESD protective device at the pad terminal. In yet another embodiment, the ESD structure further includes a third N-well region disposed in the semiconductor substrate adjacent the first and second N-well regions and spaced from the first and second N-well regions; a third P+ diffusion formed in the third N-well region; a third N+ diffusion formed in the third N-well region; wherein the third P+ diffusion and the third N+ diffusion form a third diode, and the third P+ diffusion is coupled to the first N+ diffusion in the first well region, and the third N+ diffusion is coupled to the first P+ diffusion in the second well region, so that the third diode is series coupled between the first and second diodes and forms a three diode string.

In a method embodiment, the method includes forming a first well region in a semiconductor substrate of a first conductivity type, the first well region of a second conductivity type; forming a second well region in the semiconductor substrate of the second conductivity type, the second well region adjacent to and spaced from the first well region; forming a first diffused region of the first conductivity type in the first well region; forming a first diffused region of the second conductivity type in the first well region; forming a second diffused region of the first conductivity type in the second well region; forming a second diffused region of the second conductivity type in the second well region; coupling a first terminal to the first diffused region of the first conductivity type; coupling the first diffused region of the second conductivity type in the first well region to the second diffused region of the first conductivity type in the first well region; and coupling the second diffused region of the second conductivity type in the second well region to a second terminal; wherein the first diffused region of the first conductivity type and the first diffused region of the second conductivity type form a first diode, the second diffused region of the first conductivity type and the second diffused region of the second conductivity type form a second diode, and the first and second diodes form a two diode string coupled between the first and second terminals.

In an alternative method, the method further includes forming a third well region of the first conductivity type in the semiconductor substrate, adjacent to and spaced from the first and second well regions; forming a third diffused region of the first conductivity type in the third well region; forming a third diffused region of the second conductivity type in the third well region; coupling the third diffused region of the first conductivity type to the second diffused region of the second conductivity type and coupling the third diffused region of the second conductivity type in the third well region to the second diffused region of the first conductivity type in the second well region; wherein the third diffused region of the first conductivity type and the third diffused region of the second conductivity type form a third diode in the third well region, and the third diode is coupled between the first and second diodes and the first, third and second diode form a three diode string between the first and second terminals.

In yet another alternative, the method above described wherein the first conductivity type is a P type. In still another alternative, the above method wherein the second conductivity type is an N type. In a further alternative, the method further includes coupling the first terminal to a pad terminal for an integrated circuit formed on the substrate and the second terminal to a ground terminal for the integrated circuit, the diode string coupled to form an ESD protection structure for the integrated circuit.

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a semiconductor substrate of a first conductivity type;
   a first well of a second conductivity type formed into the semiconductor substrate;
   a second well of the second conductivity type formed into the semiconductor substrate spaced from the first well;
   a first diffused region of the first conductivity type formed at an upper surface of the first well and coupled to a first terminal;
   a first diffused region of the second conductivity type formed at the upper surface of the first well;
   a second diffused region of the first conductivity type formed at the upper surface of the second well and coupled to the first diffused region of the second conductivity type;
   a second diffused region of the second conductivity type formed at the upper surface of the second well and coupled to a second terminal; and
   another diffused region of the first conductivity type formed at the upper surface of the first well, the first diffused region of the second conductivity type being interposed between the first diffused region of the first conductivity type and the another diffused region of the first conductivity type;
   wherein the first diffused region of the first conductivity type and the first diffused region of the second conductivity type form a first diode, and the second diffused region of the first conductivity type and the second diffused region of the second conductivity type form a second diode, and the first and second diodes are series coupled between the first terminal and the second terminal.

2. The semiconductor device of claim 1 wherein the first terminal is a pad terminal for receiving an input signal, and the second terminal is a ground terminal.

3. The semiconductor device of claim 1, wherein the first terminal is a ground terminal, and the second terminal is a pad terminal.

4. The semiconductor device of claim 1, wherein the first conductivity type is a P conductivity type.

5. The semiconductor device of claim 4, wherein the second conductivity type is an N conductivity type.

6. The semiconductor device of claim 5, wherein the first diffused region of the first conductivity type and the first well form a P-N junction, the first well and the substrate form an N-P junction, the substrate and the second well form a P-N junction, and a current path from the first terminal to the second terminal traverses a P-N-P-N current path.

7. The semiconductor device of claim 6 wherein the P-N-P-N current path is the current path for a silicon controlled rectifier (SCR) device coupled between the first terminal and the second terminal.

8. The semiconductor device of claim 1, wherein the first well of the second conductivity type and the second well of the second conductivity type are formed in parallel in the semiconductor substrate and spaced apart by a spacing distance, and a diffusion region of the second conductivity type is disposed between the first well and the second well.

9. The semiconductor device of claim 1, and further comprising:
   a deep well region of the second conductivity type disposed in the semiconductor substrate;
   a third well region of the first conductivity type formed within the deep well region;
   a fourth well region of the first conductivity type formed within the deep well region;
   a third diffused region of the first conductivity type formed in the third well region and coupled to a third terminal;
   a third diffused region of the second conductivity type formed in the third well region;
   a fourth diffused region of the first conductivity type formed in the fourth well region and coupled to the third diffused region; and
   a fourth diffused region of the second conductivity type formed in the fourth well region and coupled to a fourth terminal;
   wherein the third diffused region of the first conductivity type and the third diffused region of the second conductivity type form a third diode, and the fourth diffused region of the first conductivity type and the fourth diffused region of the second conductivity type form a fourth diode, and the third and fourth diodes are series connected between the third terminal and the fourth terminal.

10. The semiconductor device of claim 9, wherein a current path from the third terminal through the third diffused region of the first conductivity type into the third well region, through the third well region into the deep well region, through the deep well region into the fourth well region, and through the fourth diffused region into the fourth terminal, traverses the current path for a silicon controlled rectifier formed between the third terminal and the fourth terminal.

11. An ESD protection structure, comprising:
    a pad terminal coupled to an internal circuit formed on a P-type semiconductor substrate;
    a first silicon controlled rectifier structure coupled to the pad terminal, comprising:
      a first N-well region formed in the semiconductor substrate;
      a second N-well region formed in the semiconductor substrate adjacent the first N-well region;
      first P+ regions formed in the first N-well region, coupled to the pad terminal;
      a first N+ region formed in the first N-well region interposed between two of the first P+ regions;
      a second P+ region formed in the second N-well region, coupled to the first N+ region; and
      a second N+ region formed in the second N-well region, coupled to a ground terminal;
      wherein one of the first P+ regions and the first N+ region form a first diode, and the second P+ region and the second N+ region form a second diode, and the first and second diodes are series coupled between the pad terminal and the ground terminal to form an ESD current path from the pad terminal to the ground terminal.

12. The ESD protection structure of claim 11, and further comprising:
    a second current path from the pad terminal to the ground terminal that comprises a path into one of the first P+ regions, into the first n-well region, into the p-type substrate, into the second n-well region, and into the second N+ region, to the ground terminal.

13. The ESD protection structure of claim 11, and further comprising:

at least one additional N+ diffusion formed in the semiconductor substrate in a spacing between the first and second n-well regions, the at least one N+ diffusion coupled to a ground terminal.

14. The ESD protection structure of claim 11, and further comprising:
   a second silicon controlled rectifier structure coupled to the pad terminal, comprising:
   a third N-well region formed in the P-type semiconductor substrate including the internal circuit;
   a fourth N-well region formed in the semiconductor substrate adjacent the first N-well region and spaced from the third N-well region;
   a third P+ region formed in the third N-well region, coupled to the ground terminal;
   a third N+ region formed in the third N-well region;
   a fourth P+ region formed in the fourth N-well region, coupled to the third N+ region; and
   a fourth N+ region formed in the fourth N-well region, coupled to the pad terminal;
   wherein the third P+ region and the third N+ region form a third diode, and the fourth P+ region and the fourth N+ region form a fourth diode, and the third and fourth diodes are series coupled between the ground terminal and the pad terminal to form an ESD protective device at the pad terminal.

15. The ESD protection structure of claim 11, and further comprising:
   a third N-well region disposed in the semiconductor substrate adjacent the first and second N-well regions and spaced from the first and second N-well regions;
   a third P+ region formed in the third N-well region; and
   a third N+ region formed in the third N-well region;
   wherein the third P+ region and the third N+ region form a third diode, and the third P+ region is coupled to the first N+ region in the first well region, and the third N+ region is coupled to the first P+ region in the second well region, so that the third diode is series coupled between the first and second diodes and forms a three diode string.

16. A semiconductor device comprising:
   a semiconductor substrate of a first conductivity type;
   a first well of a second conductivity type in the semiconductor substrate, the first well comprising a P+ region and an N+ region;
   a second well of the second conductivity type in the semiconductor substrate, the second well comprising a P+ region and an N+ region; and
   a third well of the second conductivity type in the semiconductor substrate, the third well being interposed between the first well and the second well, the third well comprising an N+ region interposed between P+ regions;
   wherein the P+ region of the first well, the P+ region of the second well, and the N+ region of the third well are coupled; and
   wherein the P+ region of the first well and the N+ region of the first well form a first diode, the P+ region of the second well and the N+ region of the second well form a second diode, one of the P+ regions of the third well and the N+ region of the third well form a third diode, and another one of the P+ regions of the third well and the N+ region of the third well form a fourth diode.

17. The semiconductor device of claim 16, wherein the P+ regions of the third well are coupled to a pad.

18. The semiconductor device of claim 16, the N+ region of the first well and the N+ region of the second well are coupled to one or more pads.

19. The semiconductor device of claim 16, further comprising an additional N+ region interposed between the first well and the third well.

20. The semiconductor device of claim 16, further comprising a deep N-well, wherein the first well, the second well, and the third well are located in the deep N-well.

* * * * *